(12) United States Patent
Cohen (10) Patent No.: US 7,079,577 B2
(45) Date of Patent: Jul. 18, 2006

(54) WIDE WINDOW DECODER CIRCUIT FOR DUAL PHASE PULSE MODULATION

(75) Inventor: Daniel S. Cohen, Baltimore, MD (US)

(73) Assignee: Atmel Corporation, San Jose, CA (US)

( * ) Notice: Subject to any disclaimer, the term of this patent is extended or adjusted under 35 U.S.C. 154(b) by 35 days.

(21) Appl. No.: 10/937,225

(22) Filed: Sep. 8, 2004

(65) Prior Publication Data

US 2006/0050777 A1    Mar. 9, 2006

(51) Int. Cl.
    *H03K 9/08*    (2006.01)
(52) U.S. Cl. ............... 375/238; 329/345; 329/312; 370/205; 370/212
(58) Field of Classification Search ............. 375/55, 375/67, 80, 85, 118, 141, 238, 276, 286, 308, 375/322, 324, 331, 332, 340, 371; 370/204, 370/205, 212, 516, 517; 329/312, 313, 327, 329/345; 340/825.6, 825.61, 825.63, 825.64
    See application file for complete search history.

(56) References Cited

U.S. PATENT DOCUMENTS

| | | | |
|---|---|---|---|
| 4,049,909 A | 9/1977 | Peck | 178/67 |
| 4,080,572 A * | 3/1978 | Hastings et al. | 375/342 |
| 4,169,264 A * | 9/1979 | Parker | 342/51 |
| 4,218,770 A | 8/1980 | Weller | 375/118 |
| RE30,482 E | 1/1981 | Whitlock | 360/32 |
| 4,408,166 A | 10/1983 | Moeller | 329/106 |
| 4,592,072 A | 5/1986 | Stewart | 375/55 |
| 4,641,323 A | 2/1987 | Tsang | 375/80 |
| 4,686,484 A | 8/1987 | Otani | 329/109 |
| 4,768,207 A * | 8/1988 | Sejourne et al. | 375/239 |
| 4,931,751 A | 6/1990 | Keller et al. | 332/108 |
| 4,951,159 A | 8/1990 | Van Beek | 358/455 |
| 5,027,372 A | 6/1991 | Wong | 375/67 |
| 5,157,693 A | 10/1992 | Lemersal, Jr. et al. | 375/67 |
| 5,175,549 A | 12/1992 | Back | 341/152 |
| 5,202,643 A | 4/1993 | Sato | 329/309 |
| 5,379,323 A | 1/1995 | Nakaya | 375/85 |
| 5,408,499 A | 4/1995 | Sasaki | 375/286 |
| 5,428,321 A * | 6/1995 | Yoshida et al. | 332/109 |
| 5,442,664 A | 8/1995 | Rust et al. | 375/371 |
| 5,506,873 A | 4/1996 | Suzuki | 375/324 |
| 5,614,861 A | 3/1997 | Harada | 329/308 |
| 5,625,645 A | 4/1997 | Greier et al. | 375/276 |
| 5,627,500 A | 5/1997 | Wolaver et al. | 332/112 |
| 5,652,552 A | 7/1997 | Chung | 332/104 |

(Continued)

*Primary Examiner*—Chieh Fan
*Assistant Examiner*—Naheed Ejaz
(74) *Attorney, Agent, or Firm*—Schneck & Schneck; Thomas Schneck (57) ABSTRACT

A dual phase pulse modulation (DPPM) decoder circuit processes a DPPM signal, which is in the form of a series of high and low pulses whose pulse widths represent successive groups of M data bits, so as to recover data carried by the signal. Each of the $2^M$ possible data values of an M-bit group corresponds to one of $2^M$ distinct pulse widths. Circuit blocks determine the width of each pulse by piping the DPPM signal through a short delay chain and inputting the delayed outputs and the non-delayed signal into AND logic gates, whose outputs are used to clock flip-flop registers. The registers are reset to a known state at the start of each signal pulse and toggled to an opposite state if clocked. The registered outputs are interpreted by logic to obtain the corresponding M-bit groups.

10 Claims, 6 Drawing Sheets

U.S. PATENT DOCUMENTS

| | | | |
|---|---|---|---|
| 5,841,816 A | 11/1998 | Dent et al. | 375/331 |
| 5,924,050 A * | 7/1999 | Maruyama | 702/60 |
| 5,963,074 A | 10/1999 | Arkin | 327/276 |
| 5,977,821 A | 11/1999 | Shibata | 329/306 |
| 6,025,758 A | 2/2000 | Lu | 332/100 |
| 6,094,450 A | 7/2000 | Shockey | 375/141 |
| 6,115,428 A | 9/2000 | Kim | 375/308 |
| 6,204,726 B1 | 3/2001 | Toshinori | 329/304 |
| 6,255,866 B1 | 7/2001 | Wolaver et al. | 327/107 |
| 6,297,691 B1 | 10/2001 | Anderson et al. | 329/300 |
| 6,429,693 B1 | 8/2002 | Staszewski et al. | 327/12 |
| 6,439,679 B1 * | 8/2002 | Roylance | 347/9 |
| 2003/0035496 A1 | 2/2003 | Noda | 375/308 |
| 2003/0198478 A1 | 10/2003 | Vrazel et al. | 398/183 |

* cited by examiner

WIDE WINDOW DECODER CIRCUIT FOR DUAL PHASE PULSE MODULATION

TECHNICAL FIELD

The present invention relates to electronic decoder circuitry for the demodulation of received signals in order to recover digital data carried thereby, and relates especially to this recovery of the data with particular regard to the type of signal modulation used.

BACKGROUND ART

The different types of communication signals are typically classified according to modulation type. Each of the various forms of modulation has its own set of advantages and disadvantages relative to a specific application for which it will be used. Some factors to consider in choosing a particular form of modulation include bandwidth, power consumption requirements, and the potential for signal propagation errors and recovery of the original information. Low power consumption is particularly sought when using capacitively-loaded transmission lines. For digital data, whether the modulated signal is self-clocking or requires a separate reference clock may be important. The relative simplicity or complexity of the modulating and demodulating circuits may also be a factor in the decision to chose a particular modulation form.

Each type of signal modulation has specialized decoder circuitry for performing the demodulation and data recovery. For example, U.S. Pat. No. 5,614,861 to Harada describes a system for demodulation of a phase-modulated signal, in particular a quad phase-shift keyed (QPSK) signal, that employs a set of phase detectors with one input of each phase detector receiving the signal to be demodulated. At least one other input receives a reference clock of specified phase delay, different for each phase detector, from a phase-locked loop (PLL) controlled clock generation circuit. Results of the phase detection are then input into data generation circuitry comprising logic gates for converting the detection results into a pair of data bits.

A decoder circuit for a low power, high bandwidth, pulse width type of signal modulation would be desirable.

DISCLOSURE OF INVENTION

The present invention is a decoder circuit that processes a dual phase pulse modulated (DPPM) signal, so as to recover the data carried by the signal. A DPPM signal is in the form of a serial stream of high and low pulses whose time durations (or "pulse widths") represent successive M-bit groups of data bits. Each of the $2^M$ possible data values of an M-bit group uniquely corresponds to one of $2^M$ distinct pulse widths. Both the high signal pulses and the low signal pulses represent M-bit data. The decoder converts the series of signal pulses back into an ordered sequence of data bits without requiring an independent or recovered clock.

More particularly, the individual pulse widths for each high or low signal pulse may be determined by piping the modulated signal through a short delay chain and then combining the delayed outputs with the original non-delayed signal in a set of AND logic gates. The delay chain provides specified delays selected so that the overlapping delayed and non-delayed signals generate unique combinations of comparison results from the gates representing each of the possible M-bit data values. The AND gates will either output a high pulse or not depending on the lengths of the incoming signal pulses. The outputs from the AND logic gates are coupled to the clock inputs of corresponding flip-flop registers to set them to an opposite state from their previous state, thus storing the comparison value from each AND gate. The registered output from the flip-flops may be interpreted by decode logic means for determining the successive pulse widths and converting the determined pulse widths into corresponding groups of M-bit data. Since the decoded data are derived from the lengths of the incoming pulses, the decode function is complete.

The decoder circuit may be implemented with separate high and low pulse width determining circuits, each substantially identical, with the circuit block dedicated to determining the width of the high pulses being coupled to receive the DPPM signal directly from a signal input, but with the circuit block dedicated to determining the width of the low pulses coupled to the signal input through a signal inverter. The groups of data bits recovered by both circuit blocks may then be interleaved and combined into data words in a parallel output register. However, it is also possible to implement the decoder using a single pulse width determining circuit for both the high and low pulse phases.

DETAILED DESCRIPTION OF THE DRAWINGS

BEST MODE FOR CARRYING OUT THE INVENTION

Figure 3:
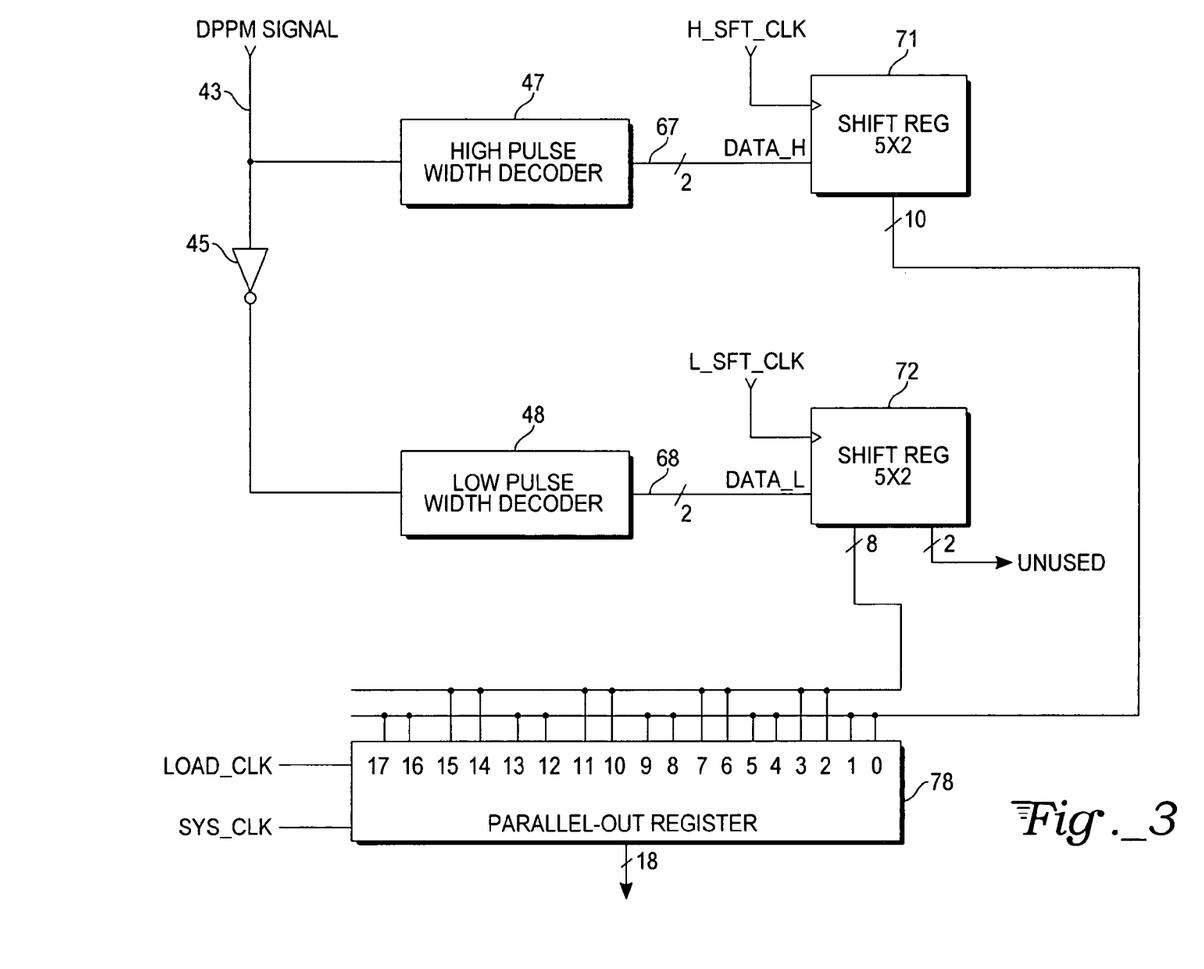
FIG. 3 is a block level schematic diagram of an exemplary DPPM decoder circuit with high pulse and low pulse width decoders in accord with the present invention.
Figure 4:
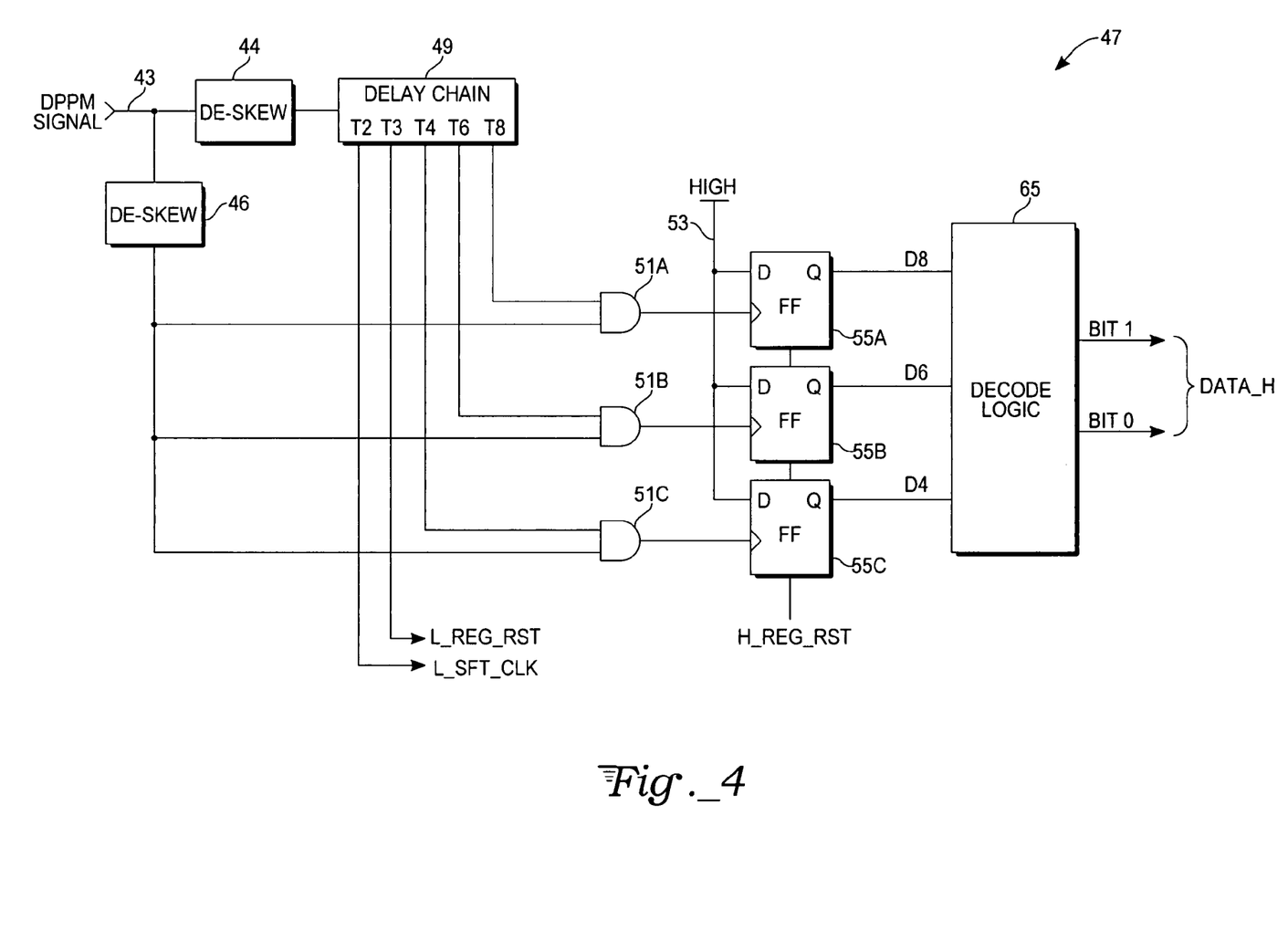
FIG. 4 is a block level schematic diagram showing details of an exemplary high-pulse width decoder for the DPPM decoder circuit of FIG. 3. Low pulse width decoders are substantially identical.

The present invention is a decoder circuit (an embodiment of which is shown in FIGS. 3–5) that converts dual phase pulse modulation (DPPM) signals back into their digital data representation.

The DPPM Signal Decoded by the Present Invention:

DPPM is a method of representing data, resident in digital circuitry in the form of binary circuit states (ones and zeros), as a string of alternating high and low signal pulses whose respective durations or widths represent 2 (or more) bits of data per pulse. The DPPM signal modulation technique is described in U.S. patent application Ser. No. 10/836,705, filed Apr. 29, 2004, which is assigned to the assignee of the present invention. That prior application also describes exemplary encoder hardware for producing the DPPM signal, as well as a different decoder circuit from the one described herein.

"Dual Phase" refers to the fact that the information is sent in a DPPM signal in both the high-going pulses and the low-going pulses. Most pulse width modulation schemes simply vary the width of the high going pulses and therefore are really only modulating the duty cycle. DPPM independently modulates the widths of both high and low going pulses, with different groups of bits encoded in the high and low portions of each "cycle." Therefore, clock period and duty cycle are not valid concepts with respect to the generated pulse train.

Figure 1:
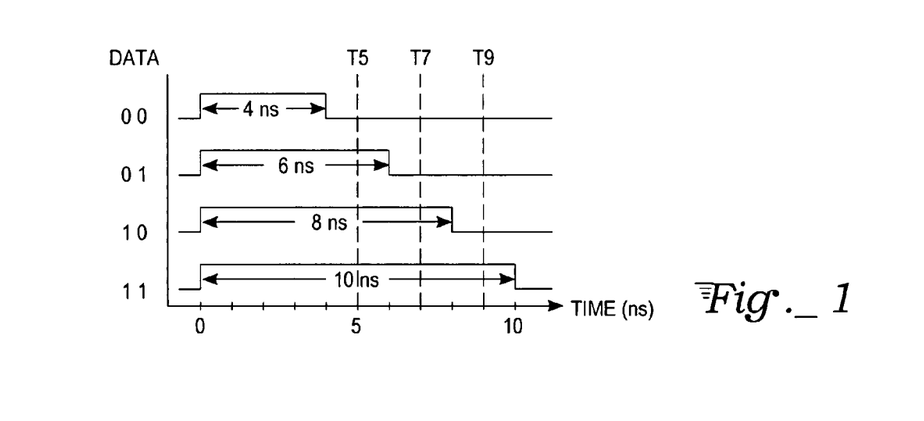
FIG. 1 is a graphical illustration (signal value versus time) of a set of DPPM pulses of various pulse durations for representing a corresponding set of dibit data symbols in accord-with the present invention.

An exemplary embodiment of DPPM modulation, shown in FIG. 1, uses 2 bits for encoding. The pairs of bits are encoded using a set of distinct pulse widths representing each possible dibit symbol value, such as:
00=4 ns pulse
01=6 ns pulse
10=8 ns pulse
11=10 ns pulse The choice of 4, 6, 8, and 10 ns pulse widths is arbitrary and could just as well have been 4, 5, 6, and 7 ns or some other pulse widths, provided the decoding circuitry at the receiving end of a DPPM signal transmission can correctly distinguish the different pulse widths from each other. In addition to the particular decoding circuit, process variations, temperature/voltage variations, and signal degradation, and noise in the propagating environment also establish a practical limit to the number of bits that can be encoded per pulse. For a DPPM signal encoding 3 bits per pulse, 8 (=$2^3$) possible pulse widths must be resolved correctly, while a signal encoding 4 bits per pulse has 16 (=$2^4$) possible pulse widths that must be resolved correctly. The data rate can be considered to be the number of encoded bits per second (or alternatively, the number of pulses per second), which depends on the number of pulses per system clock cycle and on the system clock frequency.

Figure 2A:
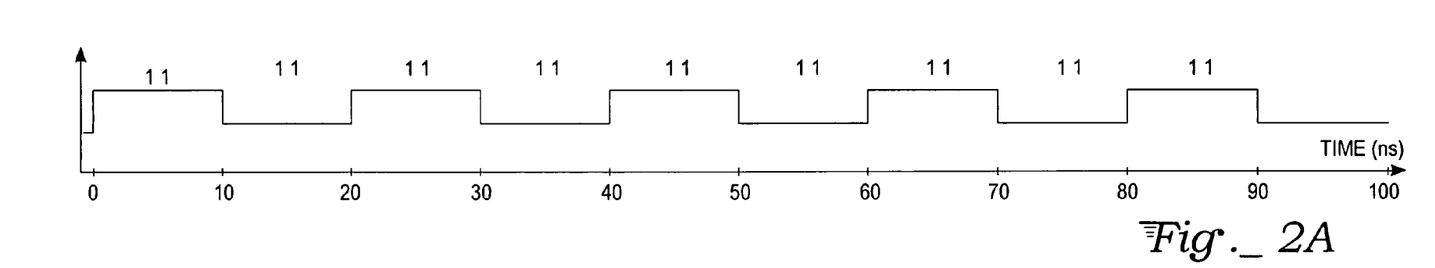
FIGS. 2A and 2B are graphical illustrations of DPPM pulse trains in accord with the present invention for a set of exemplary data, showing transmission of a series of 9 high and low going pulses within a single 100 ns system clock period.
Figure 2B:
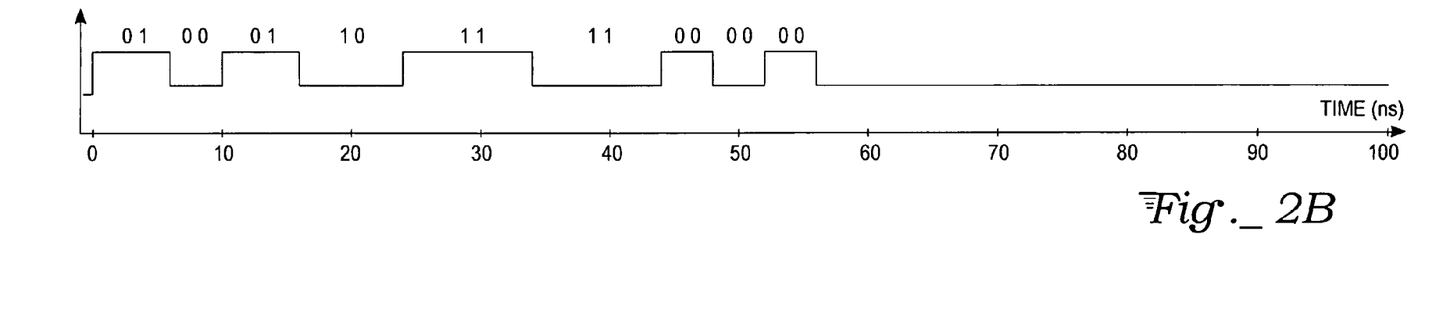

DPPM is by its nature "clockless," meaning the data can be decoded by simply detecting the widths of the pulses with respect to each transition. This means that no clock need be sent with the data, nor must a clock be encoded and recovered from the data. Additionally, there is no need to have a clock present within the decoding circuitry. This is a major advantage when time critical bursts are transmitted between different chips, since it removes the necessity of manipulating a clock which would introduce opportunity for timing variance and error. The only clock consideration is the fact that several pulse "cycles" will be sent within each system clock period. For example, FIGS. 2A and 2B show examples of DPPM pulse trains of alternating high and low pulses (5 high pulses and 4 low pulses) transmitting 18 bits of data (organized here as 9 dibits) in a 100 ns system clock period. These 18 bits can form, for example, a 16-bit data word with two error correction code bits appended to the word. Thus one data word may be transmitted per system clock period.

Since information is sent on both positive and negative phases of the pulse train, DPPM is by its nature a non-return-to-zero (or non-return-to-one) modulation scheme. However, it is typically desired that the sequence of pulses contained within a system clock period return to zero (or one) at the end of each such sequence. This preference is most easily implemented when, as in the examples of FIGS. 2A and 2B, the number of multi-bit symbols in a word to be represented as pulses is odd, since the final symbol in the sequence requires a return to zero (or return to one) as the trailing transition of the last pulse. However, this rule need not be followed if an extra pulse is inserted by the encoder and ignored by the decoder to force a return.

Thus, the DPPM method represents groups of N data bits, such as dibits (N=2), as signal pulses of specified widths. Each of the $2^N$ possible data values corresponds to one of $2^N$ distinct pulse widths, and alternately high and low signal pulses represent successive groups of N data bits. Signal encoding and decoding circuitry performs the conversion between the data bit and signal pulse representations of the information content.

For encoding data bits as signal pulses, received data words are first subdivided into an ordered sequence of groups of N data bits, then each group in the sequence is converted into its corresponding signal pulse representation, thus producing a series of high and low signal pulses that represent the data. One way to perform the conversion of data words into signal pulses is to specify signal pulse transition times, each corresponding to a preceding transition time that is incremented by a specified pulse width corresponding to a present group of M data bits, and then producing signal pulse transitions at those specified transition times. Exemplary encoder hardware described in U.S. patent application. Ser. No. 10/836,703, filed Apr. 29, 2004, and assigned to the assignee of the present invention, performs the conversion in this way.

For decoding a DPPM signal back into data, the pulse width for each of the high and low signal pulses is determined, then converted back into an ordered sequence of groups of N data bits, and recombined into data words. One way to perform this conversion is carried out by the exemplary decoder hardware set forth in the following description with reference to FIGS. 3–7.

A Decoder Circuit in Accord with the Present Invention:

With reference to FIG. 3, an exemplary DPPM decoder circuit of the present invention processes serial DPPM signals received on an input 43 to obtain a parallel data output, e.g., 18 bits wide, from an output register 78. High-pulse and low-pulse width decoders 47 and 48 determine the respective widths (durations) of the high and low pulses. For decoding low-going pulses, the incoming DPPM signal is first inverted by inverter 45, and then the inverted signal is sent to the low pulse width decoder 48. Each decoder operates on only high pulses. When the DPPM signal is inverted low pulses become high and are operated upon by decoder 48. High and low pulses are therefore independently decoded with substantially identical subcircuits. Moreover, the DPPM signal is decoded using only rising edges traveling through the delay chains. Problems that might result from asymmetric timing associated with rising and falling edges, e.g., in the delay chain 49 (FIG. 4) used in the pulse width decoders 47 and 48, are thereby avoided. Also, each decoder 47 and 48 has time to reinitialize its flip-flops 55A–C (FIG. 4) during the period that the other decoder is processing its pulse.

The pulse widths determined by the width decoders 47 and 48 are provided as two-bit outputs 67 and 68 from the respective decoders, representing high and low pulse data DATA_H and DATA_L, respectively. These data for each pulse are successively loaded into 5×2 serial-in, parallel-out shift registers 71 and 72. Respective clocks H_SFT_CLK and L_SFT_CLK for these shift registers 71 and 72 govern the serial shifting in of the pairs of data bits. The parallel output is always available, but is only loaded into the register 78 upon receiving a load clock signal LOAD_CLK. In an embodiment that provides signal data in 18-bit words, the rightmost pair of register locations in the low-pulse shift register 72 is not used. A 4×2 shift register could be used instead.

SYS_CLK is a system clock that is created externally to the DPPM decoder. LOAD_CLK is a load clock that is also created externally to the DPPM decoder. These clocks provide internal timing and load control of the parallel-output register 78. Pairs of data bits from the high-pulse and low-pulse shift registers 71 and 72 are loaded into the register 78 in an interleaved manner, with bits corresponding to the high pulses loaded into bit locations 17, 16, 13, 12, 9, 8, 5, 4, 1, and 0 of the register and with bits corresponding to the low pulses loaded into bit locations 15, 14, 11, 10, 7, 6, 3, and 2 of the register 78.

With reference to FIG. 4, the values of the data are generally determined by detecting the pulse widths with respect to the leading edge of each pulse. Hence, as discussed above, no extra clocks, clock lines, clock encoding, or clock recovery circuits are required at the receiver for decoding. In fact, in the present decoder, the incoming data pulses are compared with the delayed versions of those same pulses, thereby eliminating the possibility of introducing error when manipulating or recovering a clock. The modulated signal representing the data is piped through a short delay chain and outputs are used for comparison with the non-delayed signal.

More specifically, each of the high pulse and low pulse width decoders 47 and 48 (FIG. 3) includes a delay chain 49 having a total of N+1 tap outputs with N−1 of the outputs representing different stages of the delay chain, where N is the number of different delay values representing encoded data (e.g., N=4 for two-bit encoding). Tap outputs T2 and T3 are provided for resetting the registers 55A–C and controlling the shift registers 71 and 72 (in FIG. 3).

Proper delay values are important for reliably determining the pulse widths. The drive strengths of logic gates, the layout of connecting lines, and other processing factors can effect the timing of the DPPM signals driving the AND logic gates 51A–C. Accordingly, de-skew blocks 44 and 46 in each of the pulse width decoders 47 and 48 allow independent fine-tuning of delay on the DPPM signal, e.g., to account for process variations in the delay chain 49. One de-skew block 44 leads to the delay chain 49, while the other 46 leads to the AND gates 51A–C. The amount of de-skew may be controlled, for example, by a register (not shown) that tunes a vernier circuit in each of the blocks 44 and 46. In the case that the delay chain 49, or any logic in its path, is slower than expected, the undelayed signal can be slowed down by block 46 to match. Likewise, if the undelayed signal propagation path is slower than expected, the output of the delay chain 49 can be slowed down by block 44 to match. Other than these timing requirements associated with delaying the DPPM signal, the decoder is relatively tolerant of timing variations. Due to lack of setup-and-hold requirements associated with sampling circuits, this decoder maximizes a window of operation, simplifying the adjustments to be provided by the de-skew blocks 44 and 46.

As seen in FIG. 4, the rising edge of a data pulse is sent through the delay chain 49 and appears at T4, T6, and T8, which are provided to first inputs of AND gates 51A–C. The undelayed data pulse from signal input 43 is provided to second inputs of the AND gates 51A–C. The AND gates 51A–C compare the differently delayed pulses with the undelayed pulse in order to obtain a signal indicative of the pulse width, as seen in FIGS. 5A–5D.

Figure 5A:
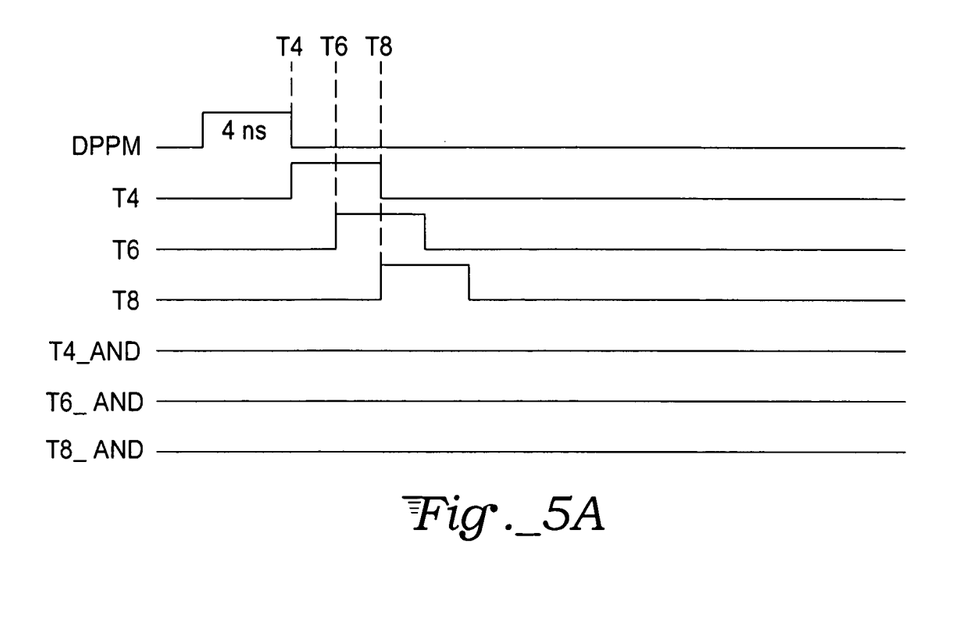
FIGS. 5A through 5D are sets of timing diagrams illustrating the operation of the delay chain and the logic AND gates in the high and low pulse width decoders for respective 4 ns, 6 ns, 8 ns, and 10 ns pulse widths.
Figure 5B:
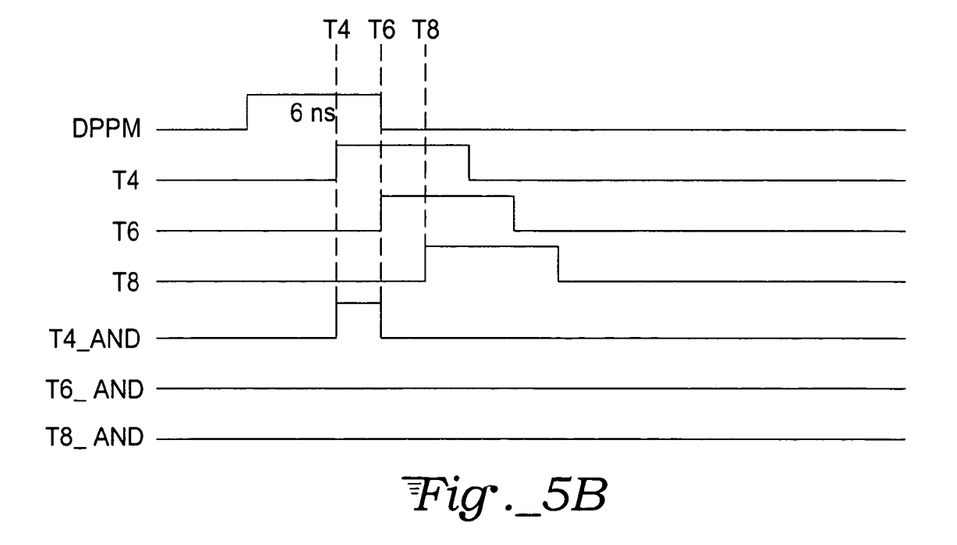
Figure 5C:
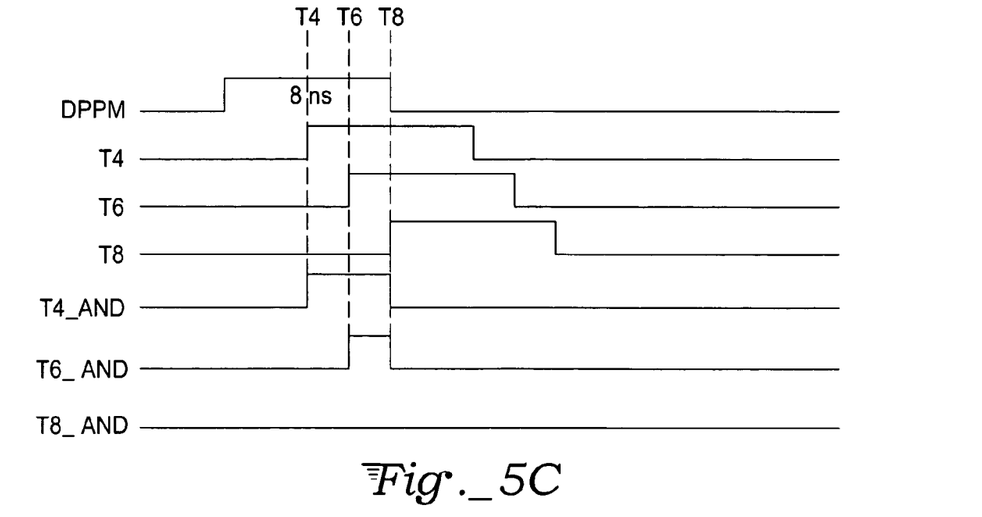
Figure 5D:
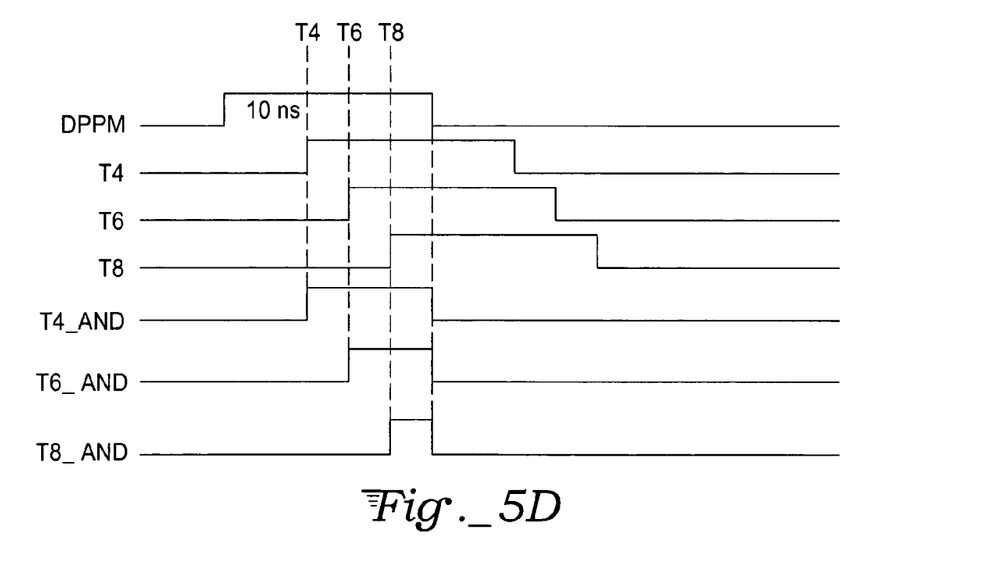

In FIG. 5A, the DPPM pulse has a width of 4 ns. The delay taps T4, T6, and T8 all produce delays of at least 4 ns, by which time the undelayed pulse has already ended. Accordingly, the AND gate outputs are all low. In FIG. 5B, the DPPM pulse has a width of 6 ns. The 4 ns delayed pulse begins before the undelayed signal has ended, so the AND gate 51C for the T4 tap produces an output pulse T4_AND. All other AND gates corresponding to 6 ns and 8 ns delays remain low, because the undelayed signal input has already ended at 6 ns. In FIG. 5C, the DPPM pulse has a width of 8 ns. Accordingly, the AND gates 51B–C corresponding to the T6 and T4 taps produce output pulses T6_AND and T4_AND, while the AND gate 51A receiving the T8 tap remains low. Finally, in FIG. 5D, the DPPM pulse has a width of 10 ns. Because all three delayed signals from taps T4, T6, and T8 begin their pulses before the undelayed pulse has ended, all three AND gates 51A–C produced pulsed outputs T8_AND, T6_AND, and T4_AND.

The outputs from the AND logic gates 51A–C are provided to clock inputs of respective resettable D-flip-flop registers 55A–C. These flip-flops may be reset to a first state (e.g., low) at delay T3 of the previous pulse of opposite phase by a reset signal H_REG_RST (likewise, reset signal L_REG_RST for the corresponding flip-flops in the low-pulse width decoder). Alternatively, the flip-flops may be reset at any time prior to the beginning of a pulse from tap T4 of the current pulse phase sufficient to ensure that the flip-flips have indeed been preset. The flip-flops also have a data input receiving a voltage level corresponding to a second state (e.g., high) that is opposite to the first state. In the exemplary embodiment shown here, the flip-flops are preset LOW and tied to a data input that is HIGH. However, they could just as easily have been preset HIGH and tied to LOW. Whenever a flip-flop is clocked by the AND gate's output pulse, it will assume the second state provided at its data input. Whenever an AND gate does not produce an output pulse, the corresponding flip-flop remains in its first state previously established by the reset signal. Thus, the flip-flop registers 55A–C store the comparison results for the various signal delays.

Figure 6:
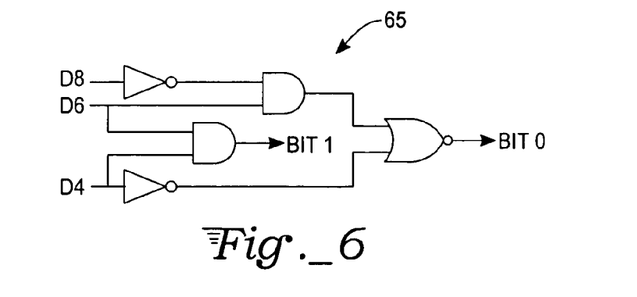
FIG. 6 is a schematic diagram of exemplary decoding logic for use in the high and low pulse width decoders of FIGS. 3 and 4.

The Q data outputs from the flip-flops 55A–C, representing the comparison results D4, D6, and D8 for the 4 ns, 6 ns, and 8 ns delays, and thus collectively representing the pulse width of the DPPM signal pulse, are provided to decode logic 65 that converts the collective results into a two-bit output DATA_H (or DATA_L for low pulses) corresponding to the determined pulse width. Exemplary decode logic 65, shown in FIG. 6, implements the truth table:

| PULSE WIDTH | FF STATE | | | DATA | |
| --- | --- | --- | --- | --- | --- |
| | D4 | D6 | D8 | BIT1 | BIT0 |
| 4 ns | 0 | 0 | 0 | 0 | 0 |
| 6 ns | 1 | 0 | 0 | 0 | 1 |
| 8 ns | 1 | 1 | 0 | 1 | 0 |
| 10 ns | 1 | 1 | 1 | 1 | 1 |

Figure 7:
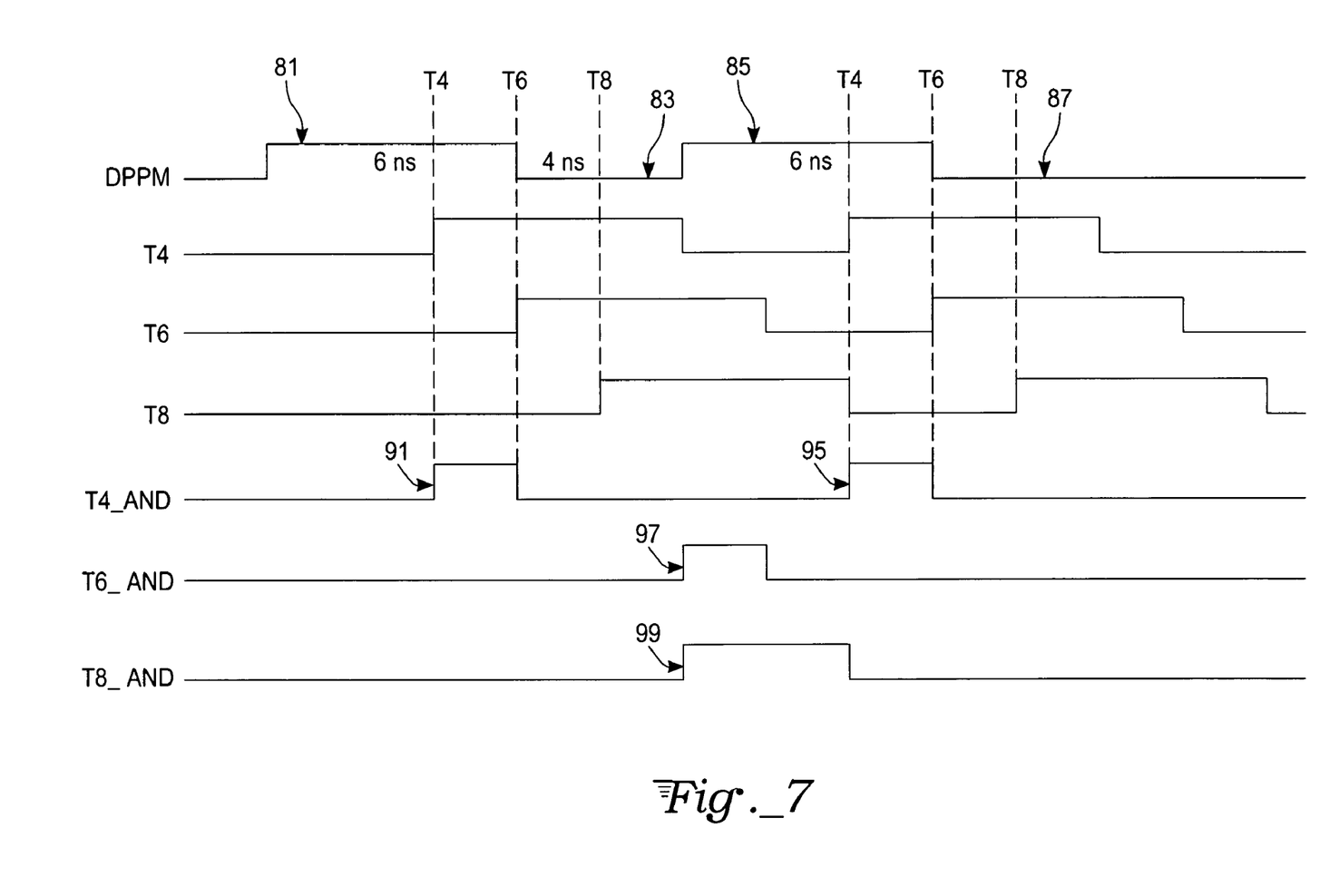
FIG. 7 is a timing diagram illustrating filtering of false pulses outside of a window of interest for a DPPM signal pulse.

With reference to FIG. 7, because the DPPM signal is really a series of pulses, the AND gates 51A–C (FIG. 4) may produce false pulses in addition to the ones of interest. The false pulses must be filtered out by the decoder. In this example, a 6 ns high pulse 81 is followed by a 4 ns low pulse 83 and then by another 6 ns high pulse 85. The high pulses 81 and 85 generate pulse outputs 91 and 95 of interest from the output T4_AND of the AND logic gate 51C. The other AND logic gates 51A–B should have an absence of pulses, but instead generate two false pulses 97 and 99. This is due to delayed signals associated with the first high pulse 81 being inadvertently compared with the undelayed second high pulse 85. (The pulse width decoder 48 decodes the low pulse 83.)

Filtering of the false pulses is accomplished by holding the decoder flip-flops 55A–C in the reset mode outside of the window of interest. With the flip-flops held in reset mode, false pulses 97 and 99 will not change the state of the flip-flops. The filtering period begins no later than the start of the second high pulse. The filtering period ends after all danger of overlap with prior delayed pulses has passed, but before the occurrence of true pulse 95 of interest. Using a delayed version of the intervening pulse 83 of opposite phase has been found to be ideal for this reset signal, since the duration of the intervening pulse establishes the time at which the next pulse begins and also determines the potential for overlap with previous delayed pulses. In the two-decoder implementation of FIG. 3, the high pulse width decoder 47 provides the reset signal for the low pulse width decoder 48, and vice versa. In particular, each decoder 47 and 48 uses a tap T3 from the other decoder's delay chain 49 to obtain the respective H_REG_RST and L_REG_RST signals for resetting their flip-flops 55A–C. In this way, false pulses, like 97 and 99, do not register in the flip-flops 55A–C.

The present DPPM decoder requires no sampling of the incoming pulse train, only comparison between delayed and undelayed versions of the pulses using logic gates and registering of the comparison results. Decoding schemes that involve sampling generally require the leading edge of a delayed pulse be carefully lined up with the non-delayed pulse in such a way that the sampling edge occurs sufficiently between any two consecutively sized pulse widths to prevent ambiguity in determining the data represented by a given pulse. The DPPM decoder presented here does not rely on sampling, but on comparing overlapping pulses. The only timing requirement is that any overlap be large enough to generate a pulse meeting the minimum pulse requirements for a clock input on the flip-flop that stores the comparison result. Thus, the present decoder has a greater tolerance to timing errors resulting from the design, layout, and fabrication of the circuit.

The DPPM decoder of the present invention has application in serial-to-parallel interfaces that provide serial data links between processor and peripheral devices, such as those commonly found in mobile phones, digital cameras, and the like. For example, the decoder could receive serial data from a microprocessor or camera sensor and present the decoded data to an LCD display or a memory device. A wide variety of such applications is possible, since DPPM transmission of data reduces the number of wires that must be routed on a circuit board between devices and allows for high data rates with comparatively low power consumption.

Although the present invention has been described in terms of an exemplary circuit for N=2, one skilled in the art can readily envision modifications to the circuitry required for any value of N, with a corresponding increase in the number of delay taps, AND logic gates and flip-flops, and with a modification of the decode logic 65.

What is claimed is:

1. A pulse width determining circuit block, comprising:
   means for producing a set of specified delays of a dual phase pulse modulation (DPPM) signal relative to a leading signal pulse edge, the specified delays being selected to correspond to all but the longest expected pulse transition times for a set of possible N-bit data values;
   a set of AND logic gates, each AND logic gate having a first input coupled to receive the DPPM signal without a delay and a second input coupled to receive the DPPM signal with one of the specified delays, each AND logic gate also having an output;
   a set of registers, each register having a reset input for resetting that register to a known state at a start of each DPPM signal pulse, a data input tied to receive an opposite value from said known state, a clock input coupled to the output of a corresponding AND logic gate, and a register output; and
   logic means, coupled to the register outputs from the set of registers, for converting the set of registered states to the corresponding N-bit data value for each DPPM signal pulse.

2. The pulse width determining circuit block as in claim 1, wherein the means for producing a set of specified delays comprises a delay chain configured to receive and propagate a DPPM signal pulse to a plurality of taps.

3. A dual phase pulse modulation (DPPM) decoder circuit, comprising:
   a DPPM signal input configured to receive a DPPM signal consisting of a series of alternately high and low signal pulses of specified widths corresponding to N-bit groups of data bits;
   a signal inverter coupled to the DPPM signal input;
   high and low pulse width determining circuit blocks coupled to the DPPM signal input, the low pulse width determining circuit block coupled to the DPPM signal input via the signal inverter, each pulse width determining circuit block constructed to output N-bit data values corresponding to pulse widths of the respective high and low signal pulses; and a parallel output register coupled to the high and low pulse width determining circuit blocks, the parallel output register configured to receive and interleave the N-bit data values and to output a data word corresponding to the DPPM signal;
   each pulse width determining circuit block having:
   means for producing a set of specified delays of the DPPM signal relative to a leading signal pulse edge, the specified delays being selected to correspond to all but the longest expected pulse transition times for a set of possible N-bit data values;
   a set of AND logic gates, each AND logic gate having a first input coupled to receive the DPPM signal without a delay and a second input coupled to receive the DPPM signal with one of the specified delays, each AND logic gate also having an output;
   a set of registers, each register having a reset input for resetting that register to a known state at a start of each DPPM signal pulse, a data input tied to receive an opposite value from said known state, a clock input coupled to the output of a corresponding AND logic gate, and a register output; and
   logic means, coupled to the, register outputs from the set of registers, for converting the set of registered states to the corresponding N-bit data value for each DPPM signal pulse.

4. The DPPM decoder circuit as in claim 3, wherein the means for producing a set of specified delays comprises a delay chain configured to receive and propagate a DPPM signal pulse to a plurality of taps.

5. The DPPM decoder circuit as in claim 3, wherein the reset input of each register in a pulse width determining circuit block is coupled to receive, from the other pulse width determining circuit block, a delayed DPPM signal with at most a delay that is less than a shortest expected pulse transition time for the set of possible data values.

6. The DPPM decoder circuit as in claim 3, further comprising a shift register configured to receive data values for successive high or low pulses of the same level and load the data values in parallel to the parallel output register.

7. A method of determining signal pulse widths, comprising:
- providing a received dual phase pulse modulation (DPPM) signal to a first input of $2^N-1$ AND logic gates where N is a number of data bits in a group of data bits;
- delaying the received DPPM signal by a plurality of specified delay times and providing each delayed DPPM signal to a second input of a different one of the AND logic gates, the delay times selected to correspond to all but a longest expected pulse transition times for the a set of $2^N$ possible discrete pulse widths;
- providing at a selected delay time during a DPPM signal of opposite phase to the received DPPM signal a reset input to each of $2^N-1$ flip-flop registers, the selected delay time being less than a shortest expected pulse transition time for the set of discrete pulse widths;
- providing the output from each of the AND logic gates to a clock input of a corresponding one of the flip-flop registers, the registers having data inputs tied to a value opposite the reset state of the registers, such that register states are toggled to an opposite state or not depending upon a length of the DPPM signal pulse; and
- logically converting a set of signal states of the flip-flop registers to a corresponding N-bit value for each signal pulse.

8. A method of operating a dual phase pulse modulation (DPPM) decoder circuit to convert a series of signal pulses into data, comprising:
- receiving a DPPM signal in the form of a series of alternately high and low signal pulses, each high or low signal pulse characterized by any of $2^N$ possible discrete pulse widths uniquely corresponding to $2^N$ possible data values of an N-bit group of data bits where N is a number of data bits in a group of data bits;
- comparing the DPPM signal with delayed versions of the DPPM signal for each of a plurality of delay times to determine a pulse width and corresponding M N-bit data value for each of said signal pulses, the comparing including:
  - (a) providing the received DPPM signal to a first input of each of $2^N-1$ AND logic gates;
  - (b) delaying the received DPPM signal by a plurality of specified delay times and providing each delayed DPPM signal to a second input of a different one of the AND logic gates, the delay times selected to correspond to all but a longest expected pulse transition times for the set of $2^N$ possible discrete pulse widths;
  - (c) providing at a selected delay time during a DPPM signal of opposite phase to the received DPPM signal a reset input to each of $2^N-1$ flip-flop registers, the selected delay time being less than a shortest expected pulse transition time for the set of discrete pulse widths;
  - (d) providing the output from each of the AND logic gates to a clock input of a corresponding one of the flip-flop registers, the registers having data inputs tied to a value opposite the reset state of the registers, such that register states are toggled to an opposite state or not depending upon a length of the DPPM signal pulse; and
  - (d) logically converting a set of signal states of the flip-flop registers to a corresponding N-bit data value for each signal pulse; and combining successive N-bit data values into data words.

9. The method as in claim 8, wherein converting the low pulses into data is performed by a separate circuit block from the converting of the high pulses into data, each circuit block being substantially identical and the DPPM signal being inverted prior to being received by the circuit block dedicated to converting the low pulses.

10. The method as in claim 8, wherein combining successive N-bit data values into data words comprises loading the data values obtained from each signal pulse into a shift register and outputting any contents of the shift register at an end of each system clock period, each system clock period characterized by a plurality of signal pulses of the received DPPM signal representing a data word.

* * * * *

UNITED STATES PATENT AND TRADEMARK OFFICE
CERTIFICATE OF CORRECTION

PATENT NO. : 7,079,577 B2 Page 1 of 1
APPLICATION NO. : 10/937225
DATED : July 18, 2006
INVENTOR(S) : Daniel S. Cohen It is certified that error appears in the above-identified patent and that said Letters Patent is hereby corrected as shown below:

Column 9, claim 7, lines 20-21: "... transition times for the a set of $2^N$ possible ..." should read:
-- transition times for a set of $2^N$ possible...--.

Column 10, claim 8, lines 3-4: "... pulse width and corresponding M N-bit data value" should read:
-- pulse width and corresponding N-bit data value --.

Column 10, claim 9, line 32: "the converting of the high pulses..." should read: --converting of the high pulses...--

Signed and Sealed this

Sixteenth Day of January, 2007

JON W. DUDAS
*Director of the United States Patent and Trademark Office*